United States Patent
Chang et al.

(10) Patent No.: US 6,717,071 B2
(45) Date of Patent: Apr. 6, 2004

(54) COAXIAL VIA HOLE AND PROCESS OF FABRICATING THE SAME

(75) Inventors: Huey-Ru Chang, Hsinchu (TW); Min-Lin Lee, Hsinchu (TW); Ted C. Ho, Hsinchu (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/809,310

(22) Filed: Mar. 16, 2001

(65) Prior Publication Data

US 2002/0017399 A1 Feb. 14, 2002

(30) Foreign Application Priority Data

Aug. 11, 2000  (TW) ........................ 89116185 A

(51) Int. Cl.⁷ .................................. H05K 1/11
(52) U.S. Cl. ................ 174/266; 174/261; 174/264; 361/734; 257/698
(58) Field of Search ................ 174/261–266; 361/792–795, 734; 257/698

(56) References Cited

U.S. PATENT DOCUMENTS

| | | | |
|---|---|---|---|
| 4,211,603 A | * | 7/1980 | Reed ........................ 216/18 |
| 4,675,788 A | * | 6/1987 | Breitling et al. ............ 361/792 |
| 5,072,075 A | * | 12/1991 | Lee et al. .................... 174/264 |
| 5,257,452 A | * | 11/1993 | Imai et al. .................... 29/846 |
| 5,374,788 A | * | 12/1994 | Endoh et al. ................ 174/266 |
| 5,689,091 A | * | 11/1997 | Hamzehdoost et al. ..... 174/255 |
| 5,834,705 A | * | 11/1998 | Jonaidi ........................ 174/261 |
| 5,949,030 A | * | 9/1999 | Fasano et al. ............... 174/262 |
| 6,353,999 B1 | * | 3/2002 | Cheng ........................... 29/852 |

* cited by examiner

Primary Examiner—John B. Vigushin
Assistant Examiner—Jose H. Alcala
(74) Attorney, Agent, or Firm—Rabin & Berdo, PC

(57) ABSTRACT

A coaxial via hole structure used in a carrier is disclosed. The coaxial via hole includes an outer cylinder-shaped conductor, an inner cylinder-shaped conductor and an intermediate fill. The outer cylinder-shaped conductor extends along a first direction. The inner cylinder-shaped conductor is disposed in the outer cylinder-shaped conductor and also extends along the first direction. The intermediate fill is between the outer cylinder-shaped conductor and the inner cylinder-shaped conductor and is made of insulating material or electrical-resistant material. The coaxial via hole structure can be applied as a capacitor or a resistor and has the function of signal shielding.

16 Claims, 17 Drawing Sheets

400

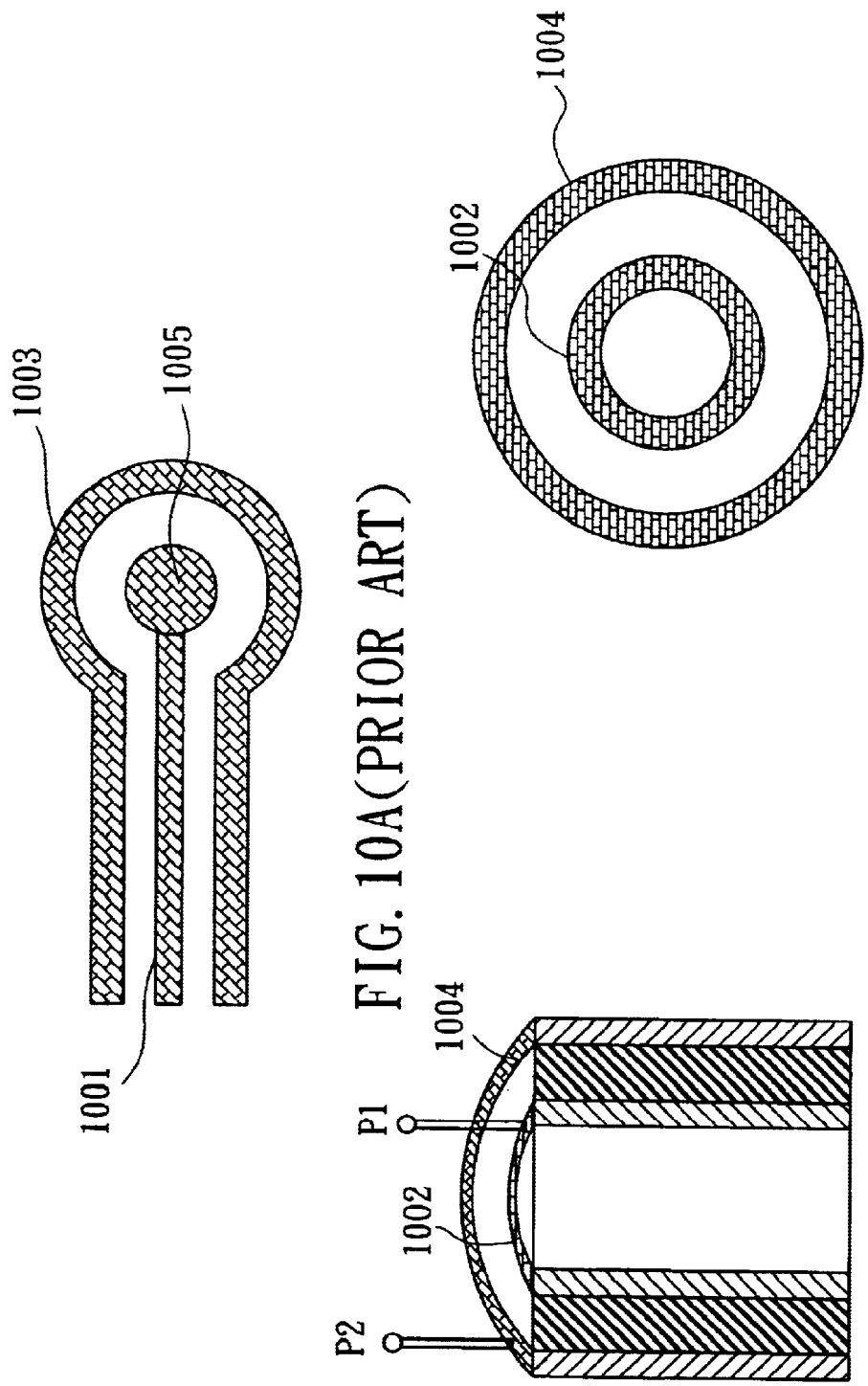

COAXIAL VIA HOLE AND PROCESS OF FABRICATING THE SAME

This application incorporates by reference Taiwanese application Serial No. 089116185, Filed Aug. 11, 2000.

BACKGROUND OF THE INVENTION

1. Field of the Invention

The invention relates in general to a structure of a coaxial via hole, and more particularly to a coaxial via hole, which can be applied as a capacitor or a resistor and has the function of signal shielding.

2. Description of the Related Art

The development and progress of the IC (Integrated Circuit) integration and fabrication and the advance of device package and circuit design is always aimed to be smaller and lighter.

Conventionally, capacitor is fixed on the circuit board by Surface Mounted Technique (SMT), as shown in FIG. 1. The capacitor 102 is fixed on the pad 104 and the pad 104 is fixed on the circuit board (not shown). Trace 106 connects the pad 104 and via 108 on the circuit board. However, capacitor 102 fixed by SMT occupies large surface area, which is against the aim of size shrinking.

Via capacitors within substrate is proposed, with the development of high dielectric constant material. A typical one is disclosed in a U.S. Pat. No. 5,055,966. FIG. 2A shows the structure of the via capacitor within the multi-layer substrate; FIG. 2B is the cross-sectional view of the structure in FIG. 2A; FIG. 2C is the equivalent circuit of the capacitor at multi-layer substrate. The circuit board contains substrates L1, L2, L3, L4 and L5. A via 203 is formed in the substrate L3 and the via 203 is filled with dielectric. The conductive trace 204 above the via 203, the conductive trace 206 below the via 203 and the via 203 itself together form a capacitor. The capacitance C thereof is a function of the thickness of the substrate L3, the diameter of the via 203 and the dielectric constant of the dielectric.

Referring to FIGS. 3A to 3C, another structure of the conventional inter-layer capacitor is disclosed in U.S. Pat. No. 5,972,231, which contains two conductive plates 302, 304 of polygonal shape on top and bottom of the substrate 306. The conductive plates 302, 304 are coupled to surrounding circuitry at the polygonal vertices through conductive traces 308, 310, respectively. The inter-layer capacitor can be further extended to be a capacitor between multi-layer substrates by using via holes.

The two conventional capacitors mentioned-above occupy smaller horizontal surface but more substrate layers. However, increasing number of substrate layer is not acceptable for some Printed Circuit Boards (PCBs) with high device density. Similar problems also occur in the resistor structure.

SUMMARY OF THE INVENTION

It is therefore an object of the invention to provide a coaxial via hole used in a carrier, includes an outer cylinder-shaped conductor, an inner cylinder-shaped conductor, and an insulating fill. The outer cylinder-shaped conductor extends along the first direction. The inner cylinder-shaped conductor is in the outer cylinder-shaped conductor and extends along the first direction. The insulating fill is between the outer cylinder-shaped conductor and the inner cylinder-shaped conductor. It is therefore another object of the invention to provide a method of manufacturing a coaxial via hole. First, the first hole is formed in a carrier. A process to make the first hole become conduct electricity is then performed to form an outer cylinder-shaped conductor on the interior of the first hole. Next, an insulating material is placed in the outer cylinder-shaped conductor to form an insulating fill. The second hole in the insulating fill is then formed. The second hole has a diameter smaller than the diameter of the first hole. Next, a process to make the second hole become conduct electricity is performed to form an inner cylinder-shaped conductor on the interior of the second hole.

It is therefore another object of the invention to provide a coaxial via hole used in a carrier. The coaxial via hole includes an outer cylinder-shaped conductor, an inner cylinder-shaped conductor and an electrical-resistant fill. The outer cylinder-shaped conductor extends along the first direction. The inner cylinder-shaped conductor is in the outer cylinder-shaped conductor and extends along the first direction. The electrical-resistant fill is between the outer cylinder-shaped conductor and the inner cylinder-shaped conductor.

It is therefore a further object of the invention to provide a method of manufacturing a coaxial via hole. First, the first hole is formed in a PCB. A process to set hole become conduct electricity is then performed to form an outer cylinder-shaped conductor on the interior of the first hole. Next, an electrical-resistant material is placed in the outer cylinder-shaped conductor to form an electrical-resistant fill. The second hole in the electrical-resistant fill is then formed. The second hole has a diameter smaller than the diameter of the first hole. Next, a process to set hole become conduct electricity is performed to form an inner cylinder-shaped conductor on the interior of the second hole.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 4A is the three-dimensional drawing of the pillar-shaped capacitor and FIG. 4B is the top view of the pillar-shaped capacitor;

FIG. 10A (Prior Art) shows a conventional conductive trace having the function of noise shielding;

FIG. 10B shows a conductive trace having the function of noise shielding according to a preferred embodiment of the invention;

FIG. 10C is the horizontal cross section of the conductive trace shown in FIG. 10B;

DESCRIPTION OF THE PREFERRED EMBODIMENT

Figure 1:
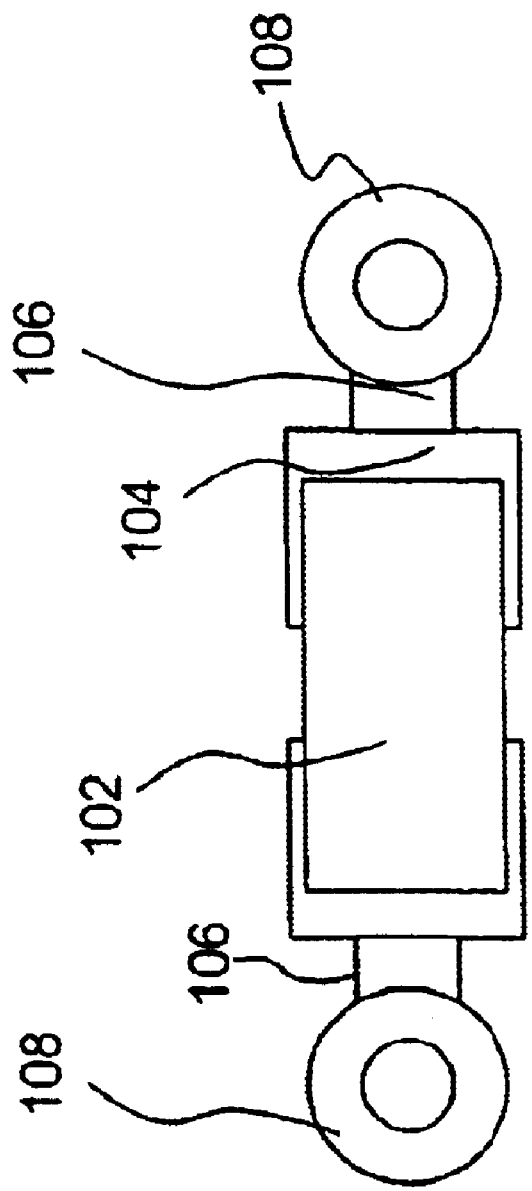
FIG. 1 (Prior Art) illustrates a conventional SMT capacitor.
Figures 2A, 2B, 2C:
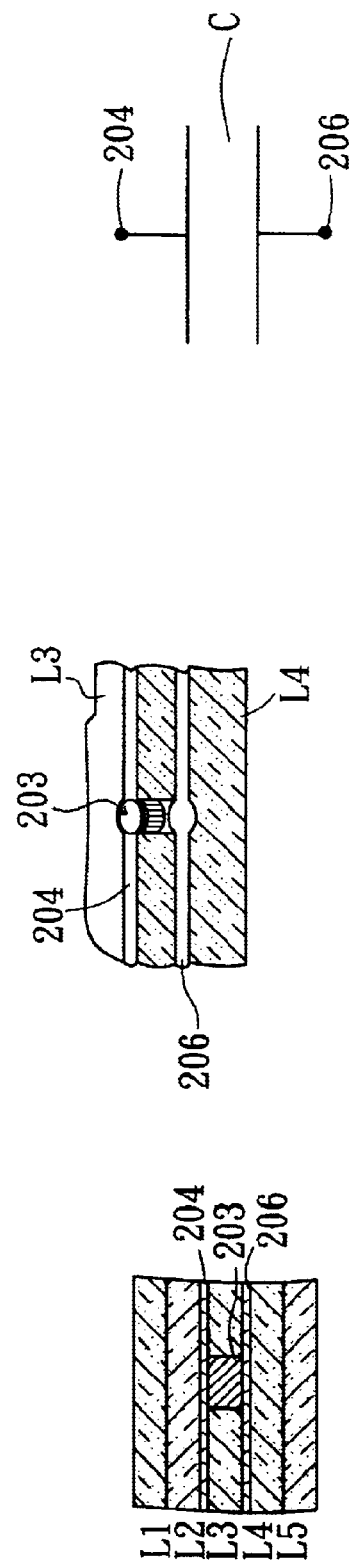
FIG. 2A (Prior Art) shows the structure of the via capacitor within the multi-layer substrate.
FIG. 2B (Prior Art) is the cross-sectional view of the structure in FIG. 2A.
FIG. 2C (Prior Art) is the equivalent circuit of the capacitor at multi-layer substrate.
Figure 3A:
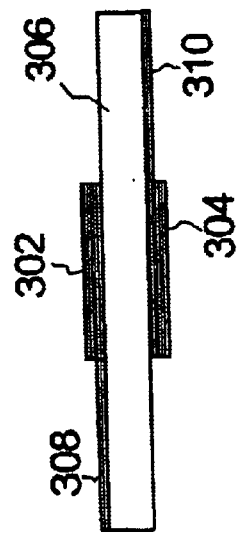
FIGS. 3A to 3C (Prior Art) show another structure of the conventional inter-layer capacitor disclosed in U.S. Pat. No. 5,972,231.
Figure 3B:
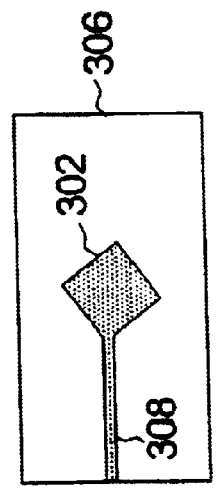
Figure 3C:
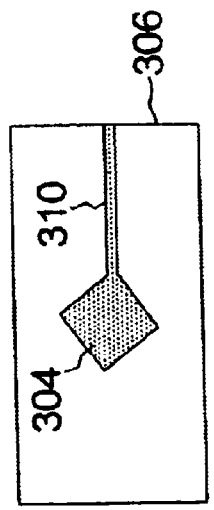
Figure 4A:
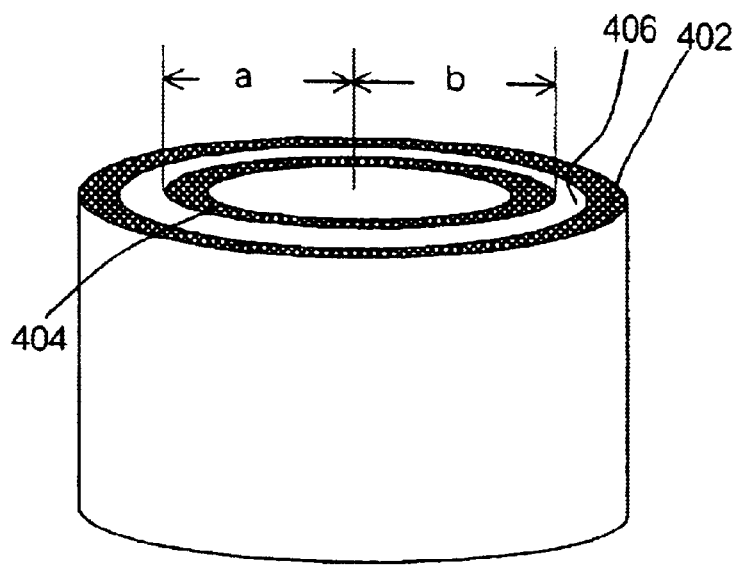
FIGS. 4A to 4B show a pillar-shaped capacitor according to a preferred embodiment of the invention.
Figure 4B:
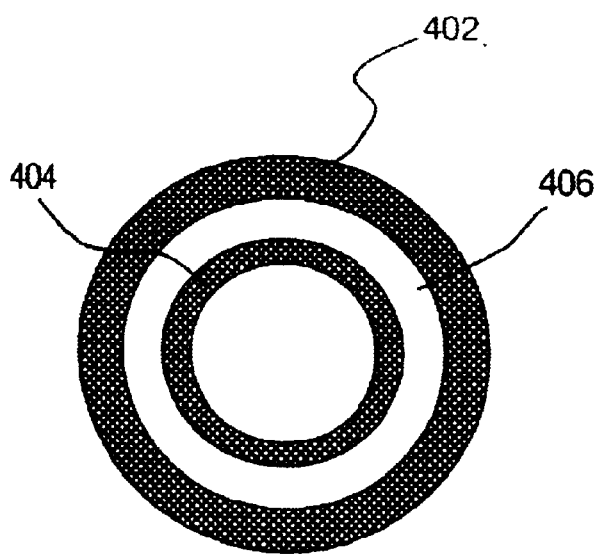

FIGS. 4A to 4B show a pillar-shaped capacitor according to a preferred embodiment of the invention; FIG. 4A is the three-dimensional drawing of the pillar-shaped capacitor and FIG. 4B is the top view of the pillar-shaped capacitor. Dielectric is filled in between the conductor 402 and the conductor 404 to form an insulating fill 406. The insulating fill 406, conductor 402 and conductor 404 together form a pillar-shaped capacitor 400. The conductor 402 and conductor 404 can be both coaxially cylinder-shaped and with different diameters. The capacitance is in proportion to the dielectric constant and conductor surface and is in inverse proportion to the distance between two conductors. The configuration of the pillar-shaped capacitor can be modified when needed but is not limited to the shape shown in the drawings.

Figure 5:
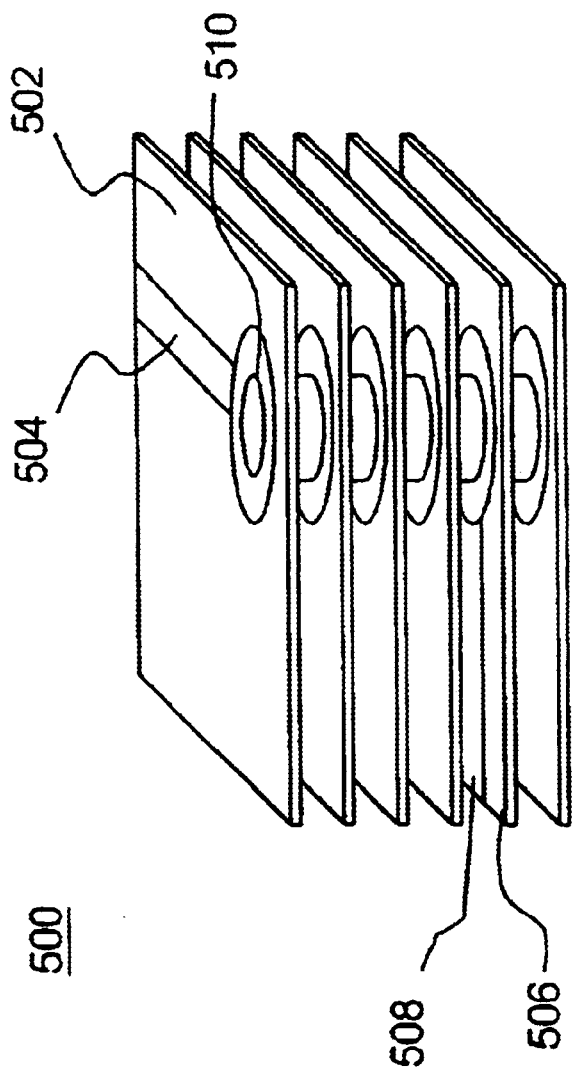
FIG. 5 (Prior Art) is a three-dimensional view of a PCB with via holes.

A three-dimensional view of a PCB with via holes is shown in FIG. 5. The PCB 500 contains a number substrate layers. Signal is transmitted between different substrate layers by a via hole 510. The via hole 510 connects the conductive trace 504 of the first layer 502 and the conductive trace 508 of another substrate layer 506. According to a preferred embodiment of the invention, the function of the via hole 510 can be further extended so that a combined structure of a via hole and a pillar-shaped capacitor is proposed.

Figure 6A:
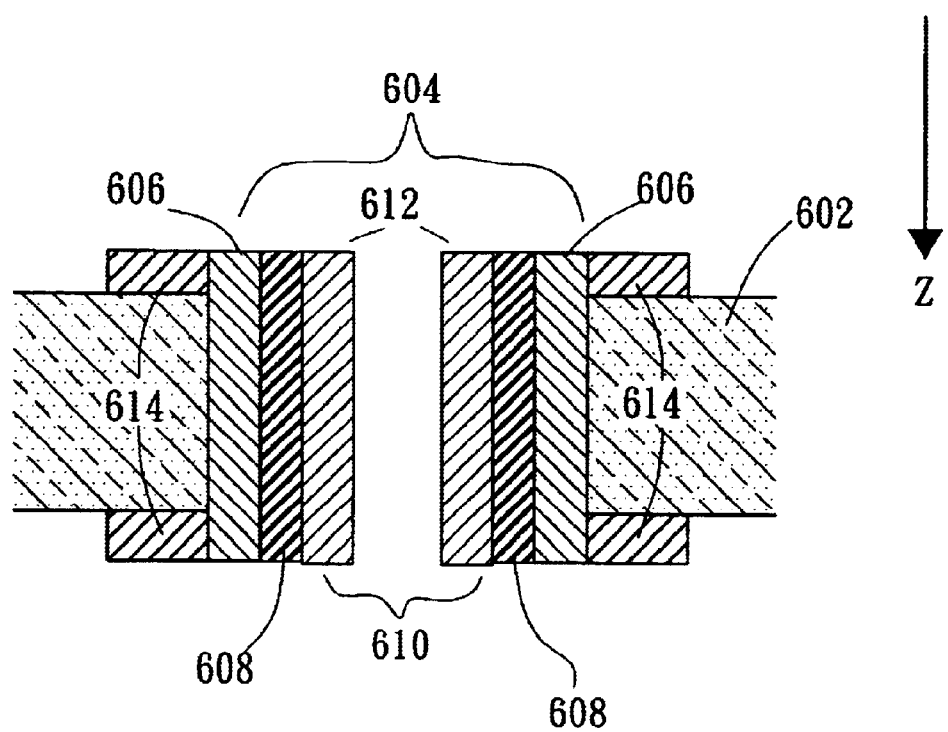
FIG. 6A shows a coaxial via holes according to a preferred embodiment of the invention.
Figure 6B:
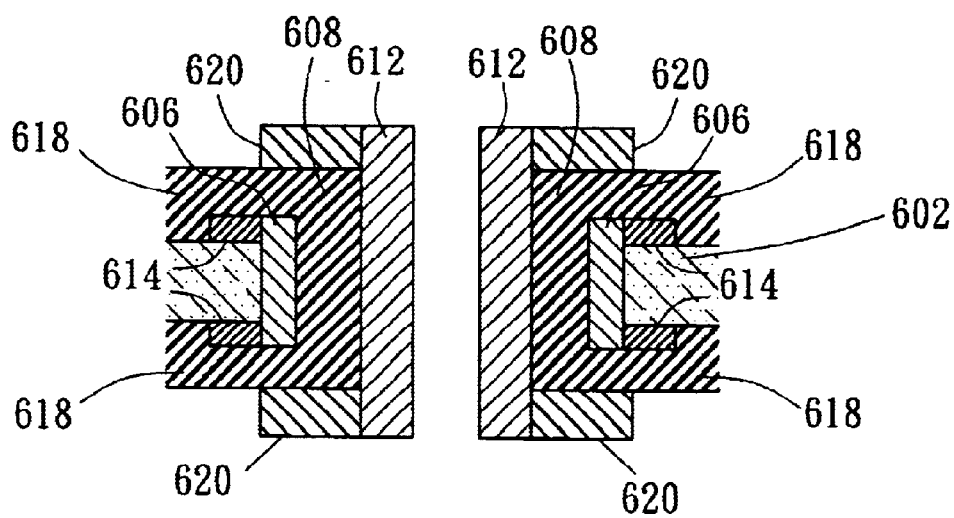
FIG. 6B shows another coaxial via holes according to a preferred embodiment of the invention.

FIGS. 6A and 6B show two coaxial via holes according to a preferred embodiment of the invention, which can be formed by the following procedure. First, a hole 604 is formed through a substrate 602. To make the interior of the hole 604 become conduct electricity is then performed to form a relatively large diameter cylinder-shaped conductor 606. Then, dielectric with high dielectric constant is placed in the cylinder-shaped conductor 606 to form an insulating fill 608. Another hole 610 with smaller diameter than the hole 604 is then formed in the insulating fill 608. The interior of the hole 610 is then made conduct electricity to form a cylinder-shaped conductor with a relatively small diameter. The process to make the interior of the holes 604, 610 become conduct electricity is preferably by plating or placing conductive paste.

Holes 604, 610 are preferably formed by photo formation or drill formation, such as mechanically drilling, laser-drilling ablation or plasma ablation. The process to make the interior of the holes 604, 606 become conduct electricity can be completed by plating or placing conductive paste. Moreover, high dielectric constant insulating material can be placed in the outer cylinder-shaped conductor 606 by plugging or laminating insulating material.

According to the process mentioned above, the coaxial via hole with the outer cylinder-shaped conductor 606, the inner cylinder-shaped conductor 612 and the insulating fill 608 therebetween is then formed. The outer cylinder-shaped conductor 606 extends along the Z-axis, which is vertical to substrate 602. The inner cylinder-shaped conductor 612 also extends along the Z-axis can is disposed in the outer cylinder-shaped conductor 606. The insulating fill 608 is between the two cylinder-shaped conductors 606, 612 and separates the two. While multi layers of substrate are used, the coaxial via hole of the invention can be also applied to connect more than one layer of substrate.

As shown in the drawings of FIG. 4A and FIG. 4B, cylinder-shaped conductors are taken as examples of the inner and outer conductors 404, 402. However, the coaxial via hole of the invention is not limited thereto. On the contrary, the inner and outer conductors can be in any shape only if the two conductors extend along with the Z-axis and are completely separated by an insulating fill. Therefore, any configurations of the two conductors with cross sections shaped in, for example, circle, round, rectangle are within the scope of the invention. Moreover, the configuration and the cross-section of the inner and outer conductors can be different from each other.

The conductor 614 connected to the outer cylinder-shaped conductor 606 as shown in FIG. 6A and FIG. 6B is formed along with the fabrication process mentioned above. Also, a similar conductor 620 connected to the inner cylinder-shaped conductor 612 as shown in FIG. 6B is formed. Electrical trace can be therefore connected to the inner and outer conductor via the conductor 620, 612, 606 or 614.

The inner conductor 612 is cylinder-shaped while it is formed by plating. However, the inner conductor 612 is solid pillar-shaped while it is formed by filling conductive paste (referring to FIG. 8). It is there clear to people who are skilled in the art that the two shapes and fabricating processes are both within the scope of the invention.

Material of the insulating fill 608 greatly influences the performance of the coaxial via hole of the invention, particularly while the coaxial via hole is used as a capacitor. Because the equivalent capacitance of a capacitor is in proportion to the dielectric constant of the insulating material between the two conductive layers, insulating material with high dielectric constant is preferred. Insulating materials such as ceramic powder and mixture of polymer with dielectric constant up to 60 are produced by DuPont and HADCO and are preferred for using in the coaxial via hole of the invention.

Figure 7B:
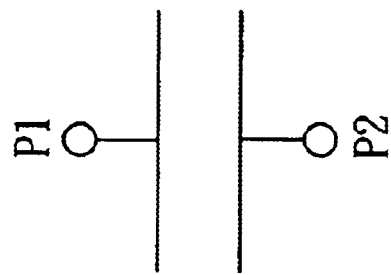
FIG. 7B is the equivalent capacitor symbol of the capacitor shown in FIG. 7A.
Figure 7A:
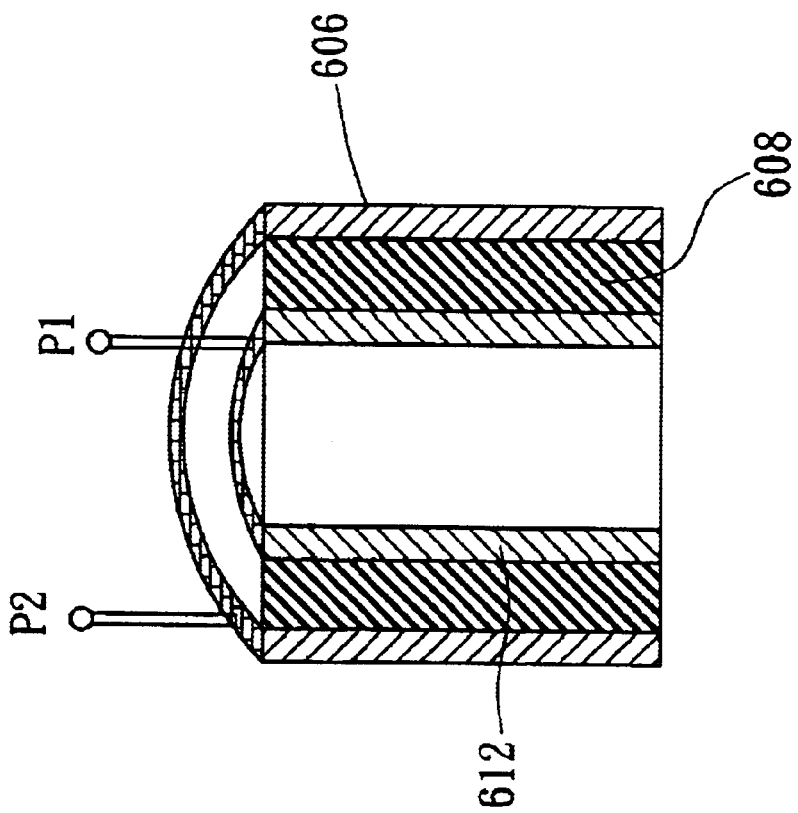
FIG. 7A is the cross-sectional view showing the coaxial via hole in FIG. 6 while it is used as a capacitor.

FIG. 7A is the cross-sectional view showing the coaxial via hole in FIG. 6 while it is used as a capacitor and FIG. 7B is the equivalent capacitor symbol thereof. The inner conductor 612 is connected to the conductor P1, which is connected to a positive voltage source (VCC) at the other end. The outer conductor 606 is connected to the conductor P2, which is connected to a negative voltage source (GND). To function as a capacitor, the inner conductor 612 and the outer conductor 606 are charged differently.

The capacitance of the capacitor of the invention is also determined by the configuration and size of the inner conductor 612 and the outer conductor 606, besides the dielectric constant of the insulating fill 608. To where the conductor P1, P2 are connected to the inner and outer conductor layers are also criteria of the capacitance, while the cross sections of the conductors are not symmetrical. Moreover, more than two capacitors with the coaxial via hole structure of the invention can be connected in parallel to adjust the capacitance when needed.

Figure 8:
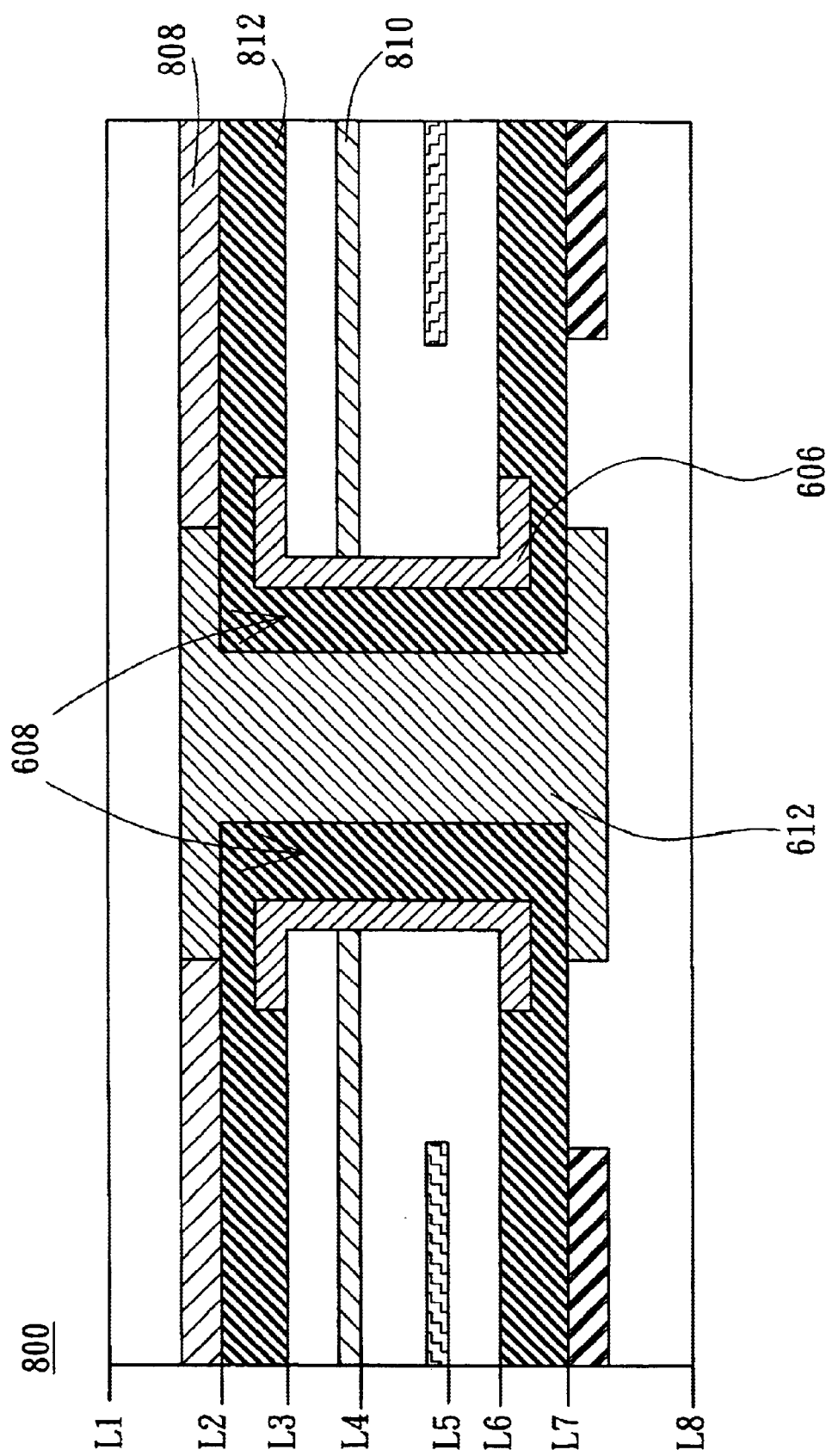
FIG. 8 shows how the coaxial via hole according to a preferred embodiment of the invention is applied to a coaxial PCB.

FIG. 8 shows how the coaxial via hole according to a preferred embodiment of the invention is applied to a multi-layer PCB. The PCB 800 includes 8 conductive layers L1~L8. In FIG. 8, the coaxial via hole of the invention penetrates through the conductive layer L3 to L6. The inner conductor 612 is connected to the conductive trace 808; the outer conductor 606 is connected to the conductive trace 810. The insulating fill 812 would be the same material with insulating fill 608 or conventional dielectric material. The inner conductor 612 and the outer conductor 606 are separated by the insulating fill 608. The conductive trace 808 is connected to a source of positive voltage and the conductive trace 810 is connected to a source of negative voltage. The coaxial via hole disposed between conductive layer L3 and L6 is only an example. On the contrary, the coaxial via hole of the invention can be configured to penetrate either a portion of the PCB 800, such as through layer L3 to L6, or to penetrate the PCB 800, i.e. through all the 8 conductive layers. Moreover, the conductive trace 808 may be connected to negative voltage source and the conductive trace 810 may be connected to positive voltage source when needed.

Figure 9B:
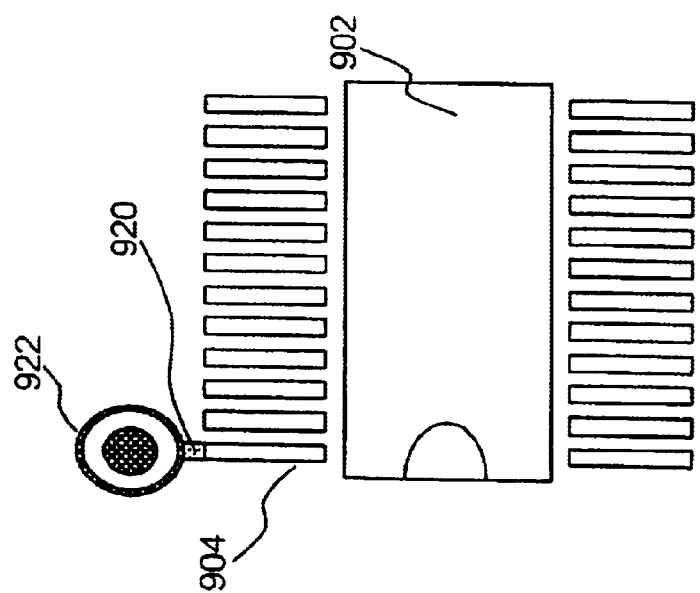
FIG. 9B (Prior Art) shows a capacitor of the invention used by a component on a PCB.
Figure 9A:
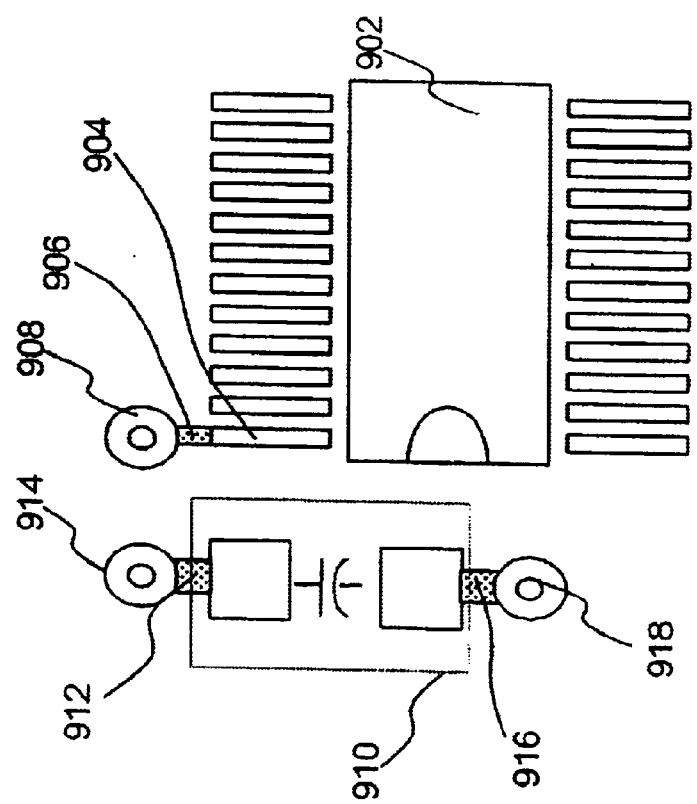
FIG. 9A (Prior Art) shows a conventional capacitor used by a component on a PCB.

FIG. 9A shows a conventional capacitor used by a component on a PCB and FIG. 9B shows a capacitor of the invention used by a component on a PCB. The component 902 on the PCB (not shown) includes a number of pins (not shown). Pad 904 of the pin is connected to a positive power source. To keep the voltage steady and eliminate the influence of the noise produced by power source, the pin of the component 902, which is connected to power source, is usually connected to a bypass capacitor via the pad 904. Referring to FIG. 9A, the pin 904 is connected to the first inner plane (not shown) through the conductive trace 906 and the via hole 908; the capacitor 910 is connected to the first inner plane (not shown) through the conductive trace 912 and the via hole 914. The other end of the capacitor 910 is connected to the second inner plane (not shown) through the conductive trace 916 and the via hole 918.

In FIG. 9B, the pin 904 is connected to the capacitor 922, the structure of which is made according to the coaxial via hole of the invention, through the conductive trace 920. The coaxial via hole type capacitor 922 is directly connected to the second inner plane.

Conventionally, referring to FIG. 9A, the path of energy flow from the capacitor 910 to the component 902 includes the capacitor 910, the conductive trace 912, the via hole 914, the via hole 908, the conductive trace 906, and the pin 904. According to a preferred embodiment of the invention, energy stored in the capacitor 922 can be transmitted to the component 902 simply by passing through the conductive trace 920 and the pad 904 of the pin. Therefore, the speed of energy transmission between the capacitor 922 of the invention and the component 902 is highly increased. Consequently, the component 902 using the capacitor 922 of the invention is able to switch voltage level more rapidly than the conventional one. So the component 902 performs normally even at high frequency. It is therefore obvious that circuit using a capacitor with the coaxial via hole structure is more suitable, than the conventional one, to the rapid voltage level switch high frequency system.

The coaxial via hole structure according to a preferred embodiment of the invention further has the function of noise shielding. FIG. 10A shows a conventional conductive trace having the function of noise shielding; FIG. 10B shows a conductive trace having the function of noise shielding according to a preferred embodiment of the invention; and FIG. 10C is the horizontal cross section of the conductive trace shown in FIG. 10B.

In a conventional circuit system, grounded trace 1003 is usually used to coil around a sensitive conductive trace 1001 so that noise can be shielded and the resistance of the conductive trace 1001 can be under control. The grounded trace 1003 prevents the conductive trace 1001 from be interrupted by the environmental noise and also avoids the noise of the conductive trace 1001 to interrupt the environment. The conventional grounded trace 1003 only provides the function of noise shielding to conductive traces on the same layer of substrate. However, while the conductive trace may extend through a via hole to another layer of the substrate, there is no protection of the conductive trace at the via hole.

According to a preferred embodiment of the invention, the inner cylinder-shaped conductor layer 1002 is connected to the conductor P1; the outer cylinder-shaped conductor layer 1004 is connected to the conductor P2, as shown in FIG. 10B. The conductor P2 is grounded and the conductor P1 is connected to a general signal trace. As shown in FIG. 10C, the whole structure of the coaxial via hole is configured like a co-axial electric cable. Consequently, the outer cylinder-shaped conductor layer 1004 provides the protection of noise shielding for the inner cylinder-shaped conductor 1002. Also, the resistance can be properly designed to be consistent.

It is apparent for people who are skilled in the art that the insulating fill between the two conductor layers is not limited to high dielectric constant material while the coaxial via hole of the invention is used to provide the function of noise shielding.

In the above description, the coaxial via hole of the invention is used in a PCB. How, PCB is only an example of various carriers. It is apparent that the coaxial via hole according to a preferred embodiment of the invention can also be applied in an IC socket, adapter, a connector, heat sink or the like. Two of the carriers are taken as examples for illustration.

Figure 11:
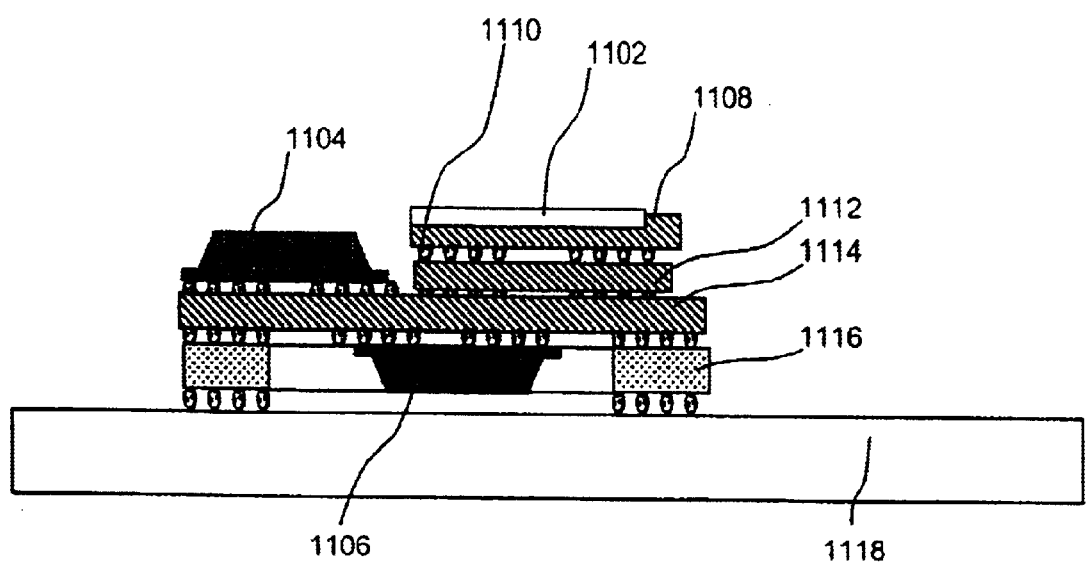
FIG. 11 is the lateral view of a computer system structure, which uses the coaxial via hole of the invention as a capacitor.

FIG. 11 is the lateral view of a computer system structure, which uses the coaxial via hole of the invention as a capacitor. The computer system in FIG. 11 includes Central Process Unit (CPU) 1102, north bridge IC 1104 and south bridge 1106. CPU 1102 is disposed on the IC socket 1108. The IC socket 1108 is connected to the adapter 1112 through a number of solder balls 1110. The adapter 1112, north bridge IC 1104, and south bridge IC 1106 are connected to the module board 1114 through solder balls 1110. The standoff board 1116 is connected to the module board 1114 and the carrier board 1118.

Figure 12:
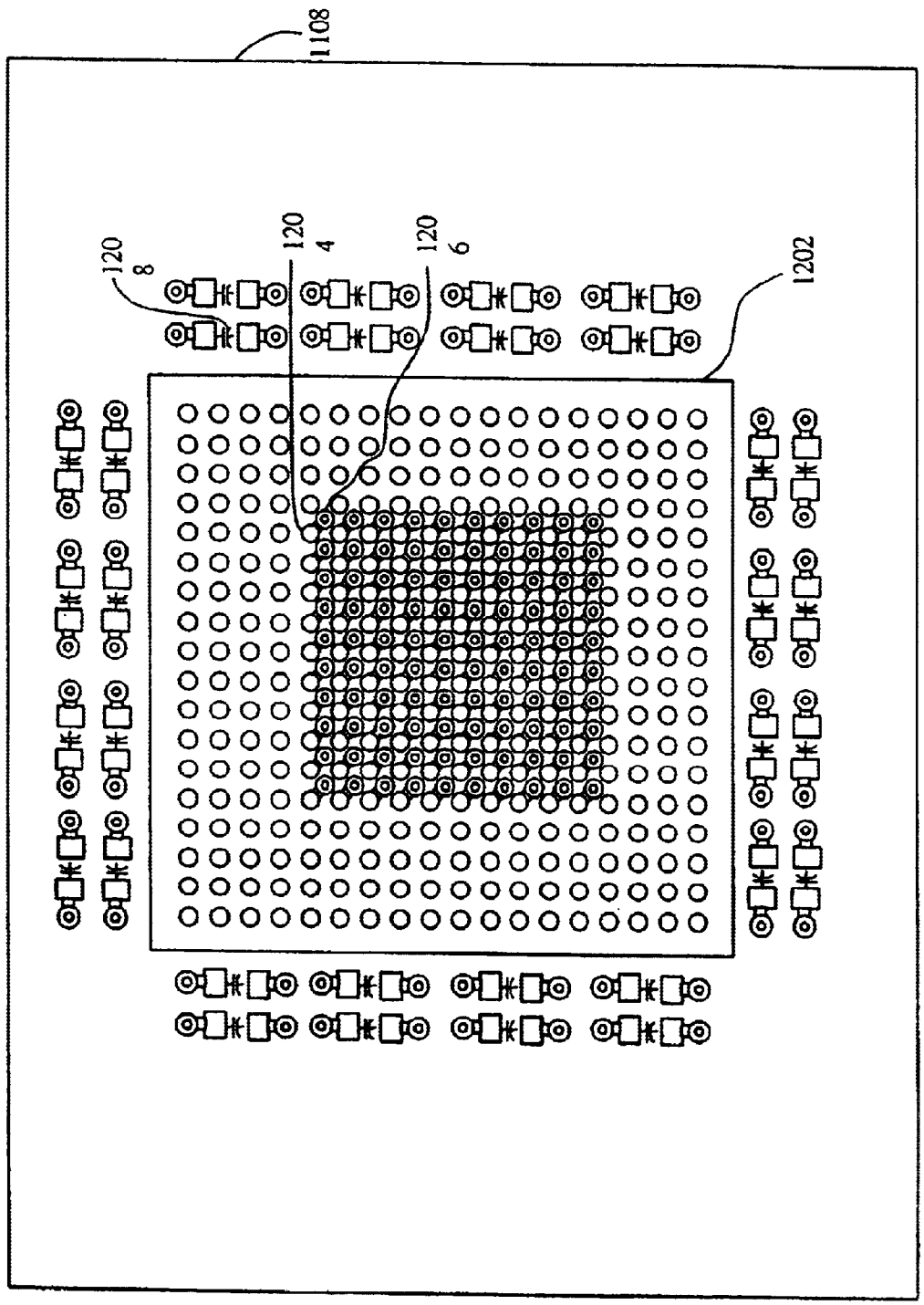
FIG. 12 (Prior Art) is the top view of a conventional module board.

FIG. 12 is the top view of a conventional module board 1114 as shown in FIG. 11. The module board 1114 includes a component welding region 1202 for connecting with the adapter 1112. The soldering region 1202 contains a number of pads 1204 corresponding to the pins connected to VCC at CPU 1102. Ideally, at CPU 1102, each pin connected to VCC needs a capacitor. Conventionally, the pin is connected to a capacitor 1208 through a pad 1204 and a via hole 1206. The capacitor is typically a Surface Mounted Device (SMD) capacitor 1208. However, as shown in FIG. 12, these SMD capacitors 1208 occupies large usable area of the module board 1114, which consequently limits the application of the module board 1114.

Figure 13:
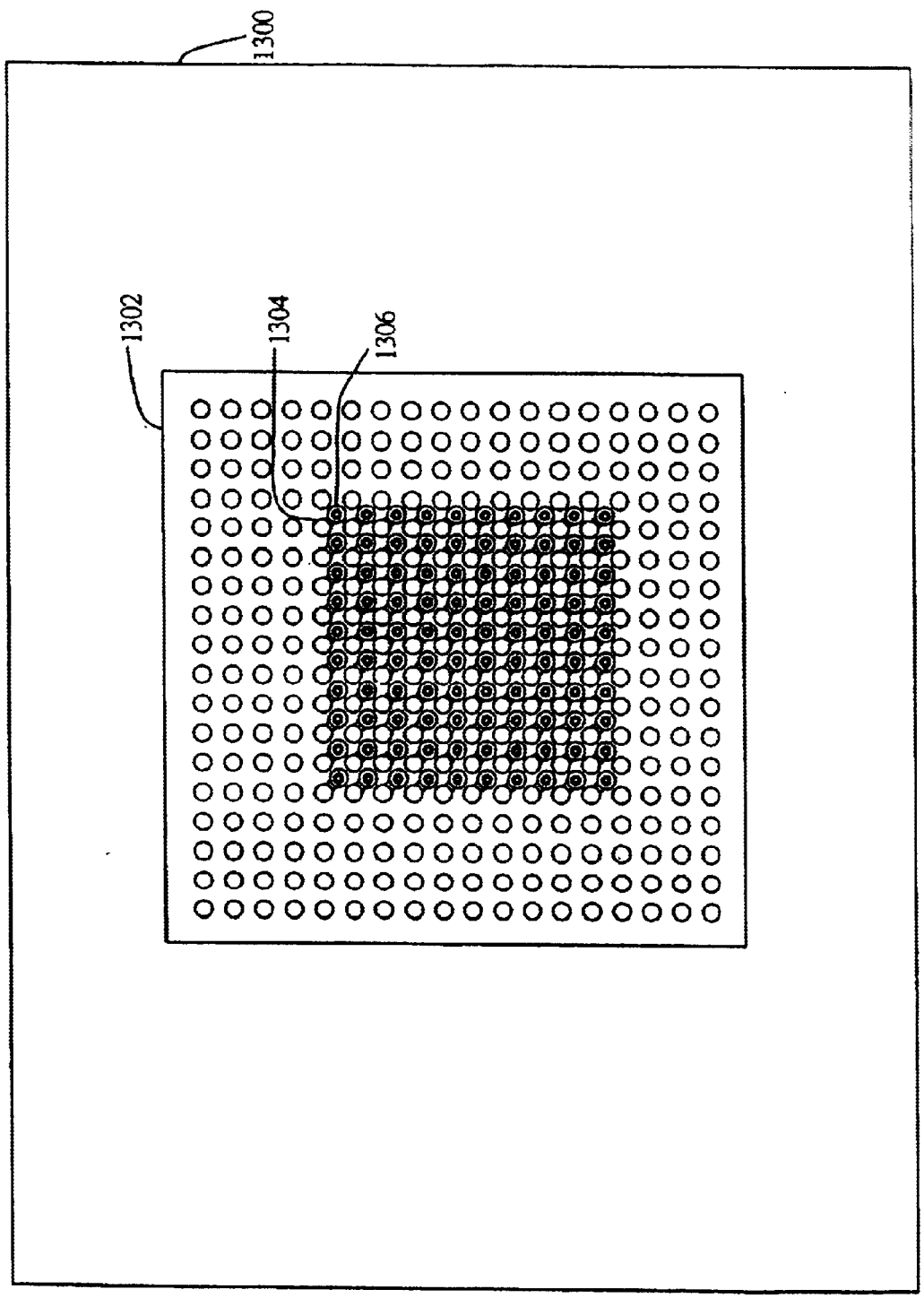
FIG. 13 is the top view of a module board with the coaxial via hole type capacitor according to a preferred embodiment of the invention.

FIG. 13 is the top view of a module board with the coaxial via hole type capacitor according to a preferred embodiment of the invention. The module board 1300 includes a soldering region 1302 for connecting with the adapter 1112. The soldering region contains a number of pads 1304 corresponding to pins connected to VCC at CPU 1102. The via hole 1306 which the pad 1304 is connected to, can be configured to have the structure and function of the coaxial via hole type capacitor according to a preferred embodiment of the invention. Thus, less area of the module board is used for the capacitor and more area of the module board can be used for other component.

The coaxial via hole of the invention can be used not only in the via hole on the module board but also the adapter 1112 and the IC socket 1108 so that the adapter 1112 and the IC socket 1108 can have the advantages of more area for other components.

Figure 14:
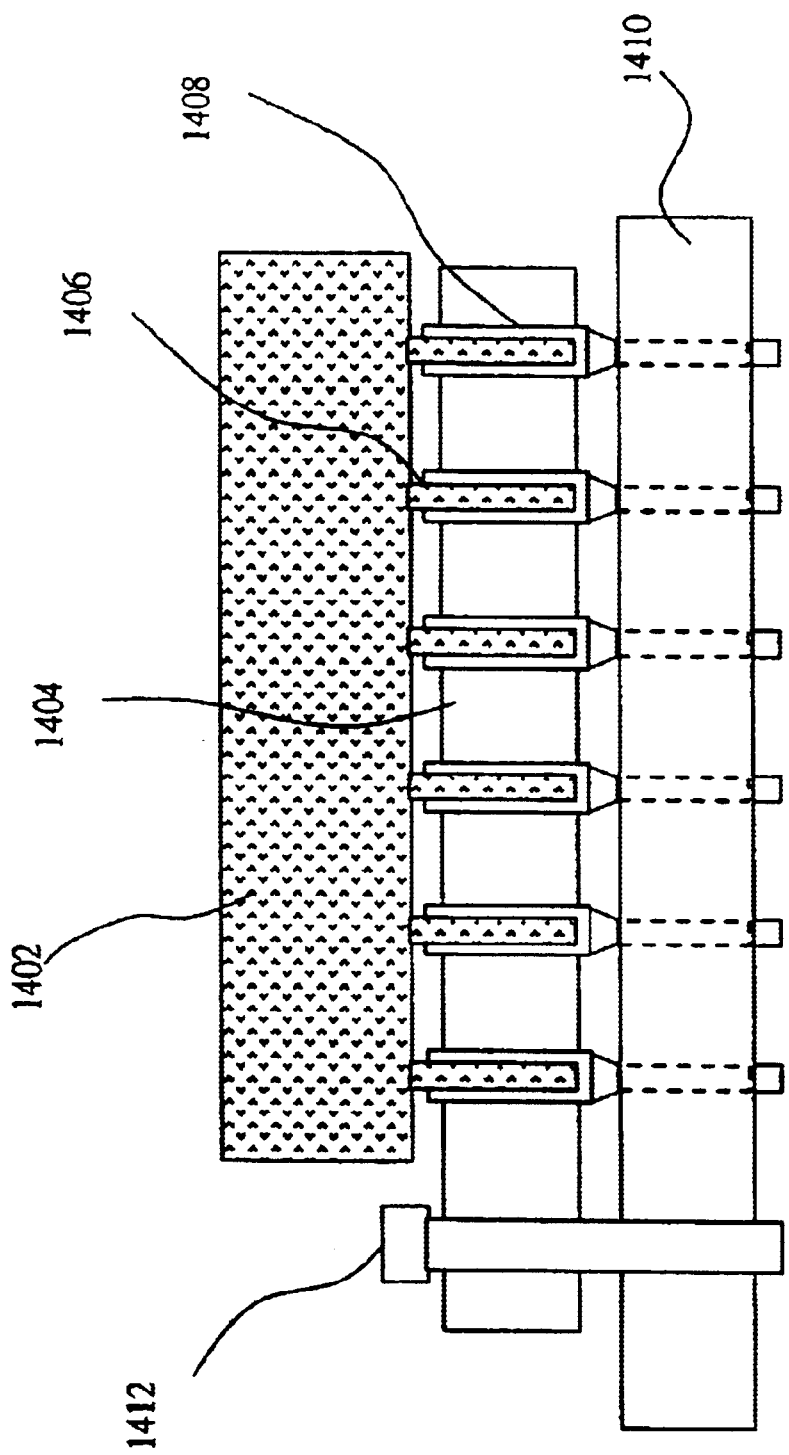
FIG. 14 (Prior Art) is the cross section of a conventional connector.

FIG. 14 is the cross section of a conventional connector. The connector in FIG. 14 includes a male connector 1402 and a female connector 1404. The pin 1406 of the male connector 1402 is inserted into the contact 1408 of the female connector 1404. The contact 1408 fixes the connector 1404 at the PCB 1410. The screw 1412 can fix the connector 1404 and the PCB 1410 together.

Figure 15:
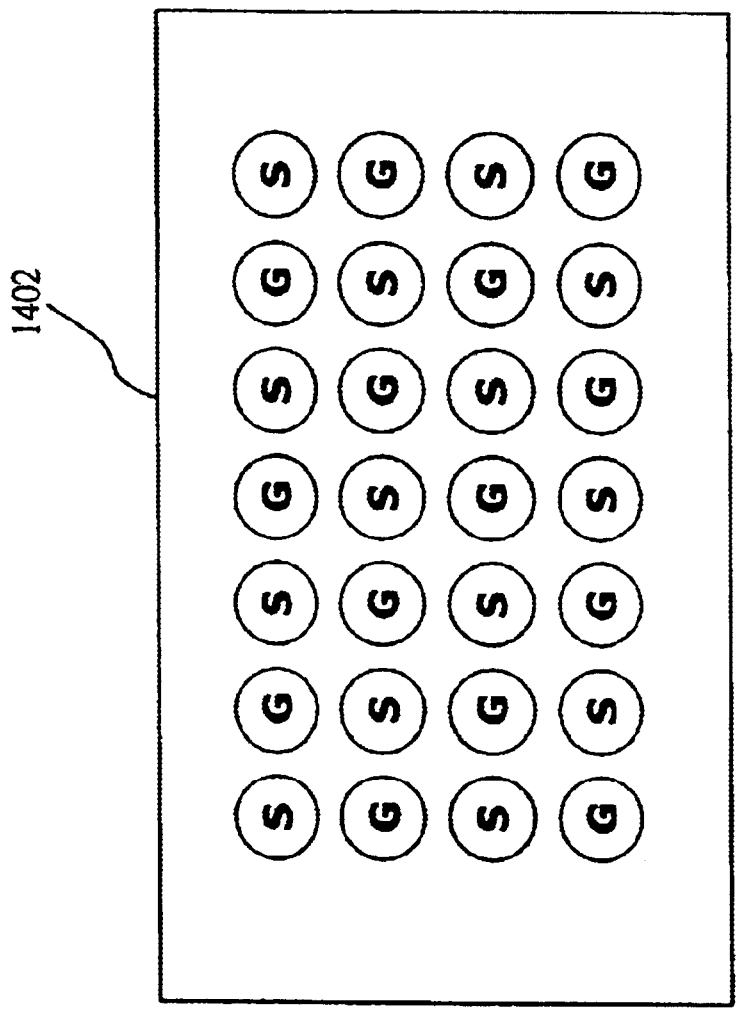
FIG. 15 (Prior Art) is the top view of the conventional pin arrangement of a high frequency circuit.

FIG. 15 is the top view of the preferred pin assignment for a high frequency circuit. Symbol S represents signal pin of the connector 1402, which outputs signals; symbol G represents grounded pin of the connector 1402. Signal pins S are designed to be surrounded by grounded pins G so that noise can be isolated from the signal pins and higher signal quality can be obtained. However, the grounded pins G occupy large area of the connector, which is against the goal of size minimization.

Figure 16:
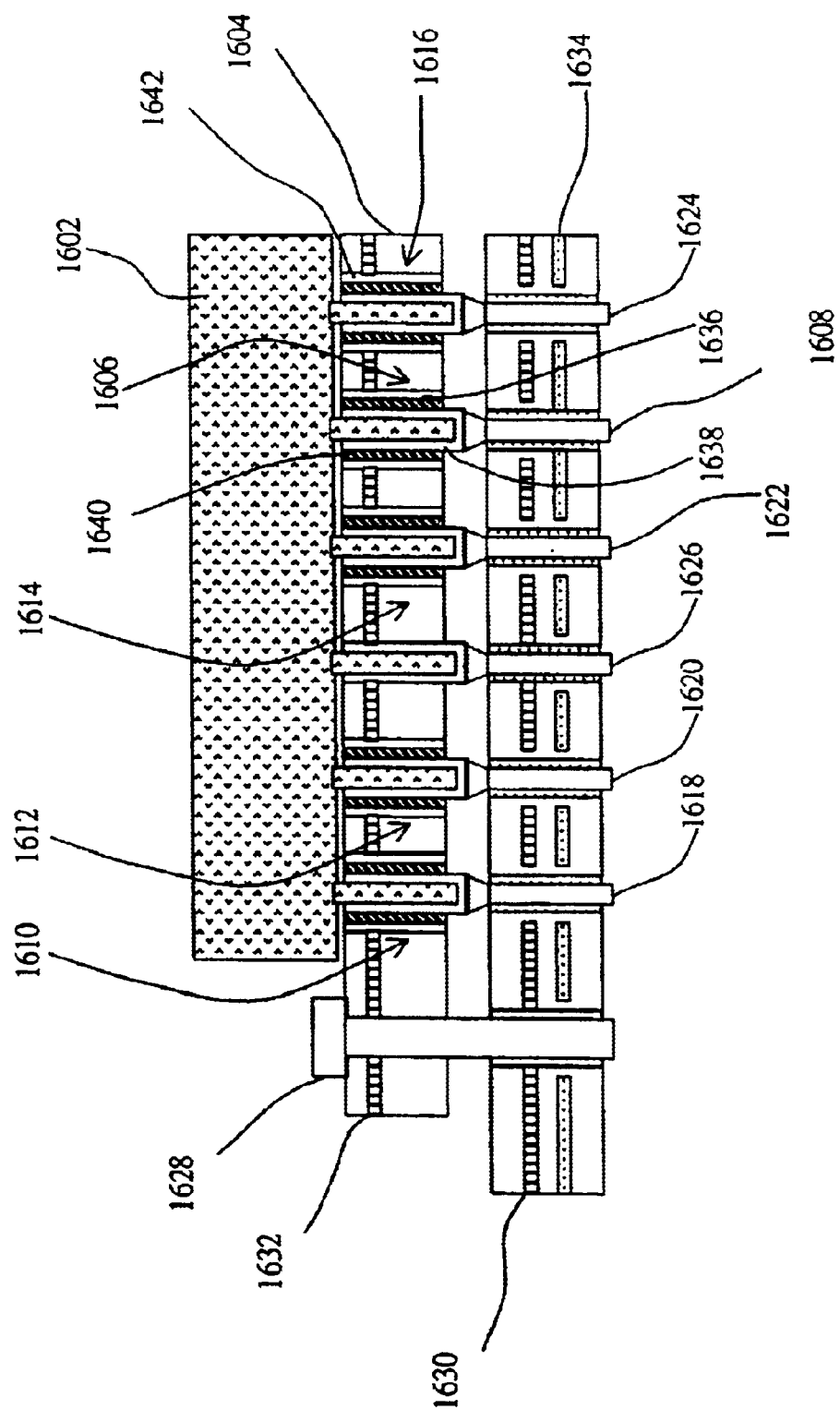
FIG. 16 is the cross section of a connector having the coaxial via hole structure according to a preferred embodiment of the invention.

FIG. 16 is the cross section of a connector having the coaxial via hole structure according to a preferred embodiment of the invention. The connector 1604 includes a contact 1608 of a capacitor 1606 having a coaxial via hole structure according to a preferred embodiment of the invention and contacts 1618, 1620, 1622, and 1624 of the coaxial via holes 1610, 1612, 1614, and 1616 which functions as signal shielding. The screw 1628 connects the negative power source 1630 and the negative power source 1632 together. The contact 1626 is connected to the grounded pin of the connector 1602, so the contact 1626 does not need to configure as the coaxial via hole of the invention in order to have the function of signal shielding. The contact 1608 is connected to the power pin of the connector 1602 and the positive power source 1634. To keep the voltage steady, the connect 1608 is also connected to the capacitor 1606. The outer cylinder-shaped conductor 1636 of the capacitor 1606 is connected to the negative power source 1632 and the inner cylinder-shaped conductor 1638 of the capacitor 1606 is connected to the positive power source 1634 along the contact 1608. An insulating fill 1640 with high dielectric constant is between the inner cylinder-shaped conductor 1638 and the outer cylinder-shaped conductor 1636. The outer cylinder-shaped conductors, such as the conductor 1642, of the coaxial via holes 1610, 1612, 1614, and 1616 are connected to a negative power source 1632 in order to have the function of signal shielding. Thus, the contacts 1618, 1620, 1622, and 1624 are prevented from the noise interference. Consequently, the pin number of the connector 1602 and the connect number of the connector 1604 are both reduced and the area which the connector 1602 and the connector 1604 occupy are greatly reduced.

The coaxial via hole of the invention can also be applied in an IC socket, to which an IC with a number of pins are fixed. The structure is as shown in FIG. 16.

Figure 17:
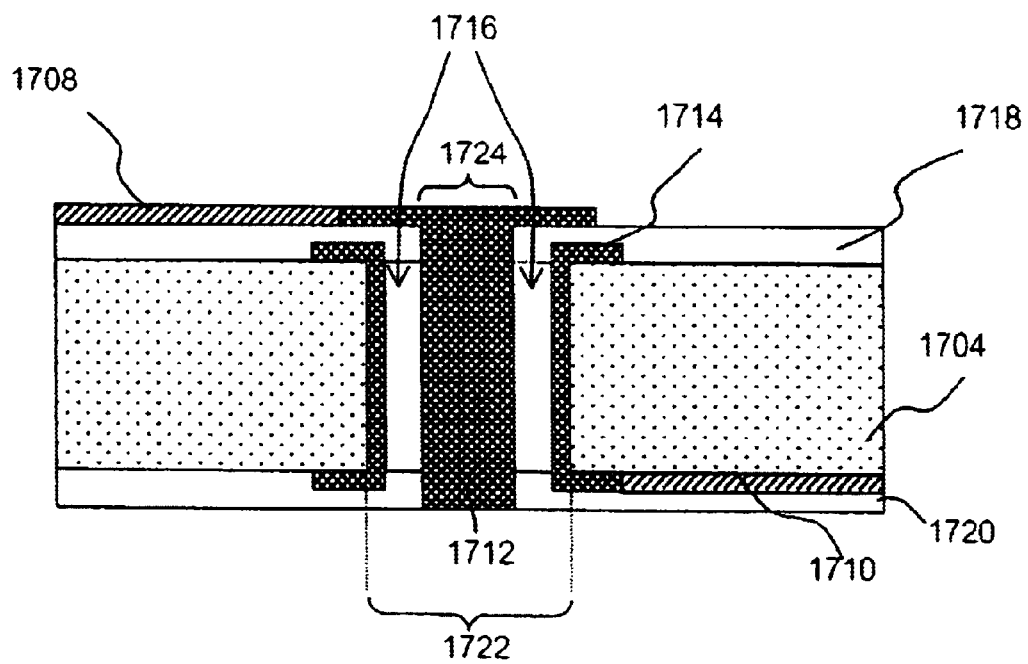
FIG. 17 shows a resistor having the coaxial via hole structure according to a preferred embodiment of the invention.

Further more, the insulating fill of the coaxial via hole structure of the invention can be replaced by an electrical-resistant material to form a resistor. Desired resistance can be obtained by choosing electrical-resistant material with different resistivity, modifying the diameters or the depth of the via hole. That is because the resistance is in proportion to the resistivity and length of the material and is in inverse proportion to the cross sectional area of the material. Please refer to FIG. 17, which shows a resistor having the coaxial via hole structure according to a preferred embodiment of the invention. The resistor with the coaxial via hole structure of the invention penetrates through the substrate 1704. The inner cylinder-shaped conductor 1712 is connected to the conductive trace 1708. The conductive trace 1708 is further connected to the signal trace, the positive voltage source or the negative voltage source. The outer cylinder-shaped conductor 1714 is connected to the conductive trace 1710. The conductive trace 1710 is further connected to the signal trace, the positive voltage source or the negative voltage source. The electrical-resistant material 1716 is between the inner cylinder-shaped conductor 1712 and the outer cylinder-shaped conductor 1714. The insulating fill 1718 and the insulating fill 1720 separates the inner cylinder-shaped conductor 1724 and the outer cylinder-shaped conductor 1714. The resistor has the same function with discrete resistor component. Each cylinder-shaped conductor 1714, 1712 would be individually connected to a positive voltage source, a negative voltage source or a signal net. The resistor in circuit would be a pull down resistor, while the outer cylinder-shaped conductor 1714 is connected to the signal net through the conductive trace 1710 and the inner cylinder-shaped conductor 1712 is connected to the negative voltage source conductor 1708. The resistor in circuit would be a pull up resistor, while the inner cylinder-shaped conductor 1712 is connected to the positive voltage source through the conductor 1708. The resistor would be a terminator, while the inner cylinder-shaped conductor 1712 is connected to the signal net through the conductor 1708. More over, the resistor with the coaxial via hole structure according to a preferred embodiment of the invention can also be applied in PCB, substrate, IC socket, adapter, connector, heat sink of other carrier so that the objective of using less area can be achieved.

Herein, a carrier with a substrate 1704 is taken as an example to illustrate the manufacturing process of a coaxial via hole as a resistor. First, a hole 1722 is formed through the substrate 1704. The interior of the hole 1722 is then set to become conduct electricity to form an outer cylinder-shaped conductor 1714. The interior of the outer cylinder-shaped conductor 1714 is then formed with a resistant material to form a resistant fill 1716. Another hole 1724 with smaller diameter than the hole 1722 is then formed to penetrate through the resistant layer 1716. The interior of the hole 1724 is then set to become conduct electricity to form a inner cylinder-shaped conductor 1712.

The capacitor with the coaxial via hole structure according to a preferred embodiment of the invention has the following advantages superior to the conventional SMD capacitor.

(1) The capacitor with the coaxial via hole structure occupies much less surface area than the conventional SMD capacitor.

(2) The capacitor with the coaxial via hole structure of the invention can be used in inner layers of a PCB but the SMD capacitor can be only used on the surface layers of PCB.

(3) The capacitor with the coaxial via hole structure of the invention can be built in the substrate but the SMD capacitor can not be applied inside the multi-layer substrate.

(4) The capacitor with the coaxial via hole structure of the invention is more suitable for the high frequency circuit than the conventional SMD capacitor; and the capacitor of the invention can also function as signal shielding.

The resistor with the coaxial via hole structure according to a preferred embodiment of the invention has the following advantages prior to the conventional SMD resistor.

(1) The resistor with the coaxial via hole structure occupies much less surface area than the conventional SMD resistor.

(2) The resistor with the coaxial via hole structure of the invention can be used in inner layers of a PCB but the SMD resistor can be only used on the surface layers of PCB.

(3) The resistor with the coaxial via hole structure of the invention can be buried in the substrate but the SMD resistor can not be applied inside the multi-layer substrate.

(4) The resistor with the coaxial via hole structure of the invention effectively shortens the trace path and reduces signal loss and delay, which is superior to the conventional SMD resistor in terms of electrical characteristics.

To sum up, the capacitor or resistor with the via hole structure of the invention has the advantages of occupying much less surface of the substrate or intra-layer surface, being able to be built in the substrate or other carrier without extra discrete capacitor, resistor and the cost thereof, and also functioning as signal shielding.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A coaxial via hole structure for a carrier, wherein the carrier has a first hole, the structure comprising:

an outer cylinder-shaped conductor formed on the interior of the first hole and extending along a first direction, wherein the outer cylinder-shaped conductor has a second hole therethrough and the second hole has a diameter smaller than a diameter of the first hole, the outer cylinder-shaped conductor being connected to a signal conductor for signal shielding;

an inner cylinder-shaped conductor formed on the interior of the second hole and extending along the first direction so that the inner cylinder-shaped conductor is disposed in the outer cylinder-shaped conductor; and an insulating fill between the outer cylinder-shaped conductor and the inner cylinder-shaped conductor.

2. A coaxial via hole structure for a carrier, wherein the carrier has a first hole, the structure comprising:

an outer cylinder-shaped conductor formed on the interior of the first hole and extending along a first direction, wherein the outer cylinder-shaped conductor has a second hole therethrough and the second hole has a diameter smaller than a diameter of the first hole;

an inner cylinder-shaped conductor formed on the interior of the second hole and extending along the first direction so that the inner cylinder-shaped conductor is disposed in the outer cylinder-shaped conductor; and an insulating fill between the outer cylinder-shaped conductor and the inner cylinder-shaped conductor; and a conductor which is connected to the outer cylinder-shaped conductor and is connected to a signal conductor for signal shielding.

3. A coaxial via hole structure for a carrier, wherein the carrier has a first hole, the structure comprising:

an outer cylinder-shaped conductor formed on the interior of the first hole and extending along a first direction, wherein the outer cylinder-shaped conductor has a second hole therethrough and the second hole has a diameter smaller than a diameter of the first hole;

an inner cylinder-shaped conductor formed on the interior of the second hole and extending along the first direction so that the inner cylinder-shaped conductor is disposed in the outer cylinder-shaped conductor;

an electrical-resistant fill between the outer cylinder-shaped conductor and the inner cylinder-shaped conductor; and a conductor which is connected to the outer cylinder-shaped conductor and is connected to a signal conductor for signal shielding.

4. The coaxial via hole structure as claimed in claim 1, wherein the first direction is vertical to a direction along which the carrier extends.

5. The coaxial via hole structure as claimed in claim 1, wherein the carrier is a printed circuit board (PCB).

6. The coaxial via hole structure as claimed in claim 1, wherein the carrier is a substrate.

7. The coaxial via hole structure as claimed in claim 1, wherein the carrier at least comprises a conductive layer and the coaxial via hole structure penetrates a portion of the carrier.

8. The coaxial via hole structure as claimed in claim 1, wherein the carrier at least comprises a conductive layer and the coaxial via hole structure penetrates the carrier.

9. The coaxial via hole structure as claimed in claim 1, wherein a cross section, in a direction vertical to the first direction, of the outer cylinder-shaped conductor can be round or rectangular, and wherein a cross section, in the direction vertical to the first direction, of the inner cylinder-shaped conductor can be round or rectangular.

10. The coaxial via hole structure as claimed in claim 1, wherein the insulating fill is made of a material with high dielectric constant.

11. The coaxial via hole structure as claimed in claim 3, wherein the first direction is vertical to a direction along which the carrier extends.

12. The coaxial via hole structure as claimed in claim 3, wherein the carrier is a printed circuit board (PCB).

13. The coaxial via hole structure as claimed in claim 3, wherein the carrier is a substrate.

14. The coaxial via hole structure as claimed in claim 3, wherein the carrier at least comprises a conductive layer and the coaxial via hole structure penetrates a portion of the carrier.

15. The coaxial via hole structure as claimed in claim 3, wherein the carrier at least comprises a conductive layer and the coaxial via hole structure penetrates the carrier.

16. The coaxial via hole structure as claimed in claim 3, wherein a cross section, in a direction vertical to the first direction, of the outer cylinder-shaped conductor can be round or rectangular, and wherein a cross section, in the direction vertical to the first direction, of the inner cylinder-shaped conductor can be round or rectangular.

* * * * *